(12) United States Patent
Loh et al.

(10) Patent No.: US 12,720,824 B2
(45) Date of Patent: Aug. 25, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wei-Yip Loh, Hsinchu (TW); Hong-Mao Lee, Hsinchu (TW); Harry Chien, Hsinchu (TW); Po-Chin Chang, Hsinchu (TW); Sung-Li Wang, Hsinchu (TW); Jhih-Rong Huang, Hsinchu (TW); Tzer-Min Shen, Hsinchu (TW); Chih-Wei Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 651 days.

(21) Appl. No.: 18/196,223

(22) Filed: May 11, 2023

(65) Prior Publication Data

US 2024/0379758 A1 Nov. 14, 2024

(51) Int. Cl.
*H01L 29/08* (2006.01)
*H10D 30/01* (2025.01)
(Continued)

(52) U.S. Cl.
CPC ......... *H10D 62/151* (2025.01); *H10D 30/024* (2025.01); *H10D 30/6211* (2025.01); *H10D 62/8503* (2025.01); *H10D 64/017* (2025.01); *H10D 64/663* (2025.01); *H10D 64/665* (2025.01); *H10D 84/017* (2025.01); *H10D 84/0193* (2025.01); *H10D 84/038* (2025.01); *H10D 84/853* (2025.01)

(58) Field of Classification Search
CPC ............. H10D 62/151; H10D 30/6211; H10D 62/8503; H10D 64/017; H10D 84/853; H10D 30/024; H10D 84/017; H10D 84/038; H10D 64/663; H10D 84/0193; H10D 64/665
See application file for complete search history.

(56) References Cited

U.S. PATENT DOCUMENTS 9,105,490 B2 8/2015 Wang et al.
9,236,267 B2 1/2016 De et al.
(Continued)

*Primary Examiner* — William C Trapanese
(74) *Attorney, Agent, or Firm* — NZ Carr Law Office

(57) ABSTRACT

A semiconductor device structure and methods of forming the same are described. In some embodiments, the structure includes an N-type source/drain epitaxial feature disposed over a substrate, a P-type source/drain epitaxial feature disposed over the substrate, a first silicide layer disposed directly on the N-type source/drain epitaxial feature, and a second silicide layer disposed directly on the P-type source/drain epitaxial feature. The first and second silicide layers include a first metal, and the second silicide layer is substantially thicker than the first silicide layer. The structure further includes a third silicide layer disposed directly on the first silicide layer and a fourth silicide layer disposed directly on the second silicide layer. The third and fourth silicide layer include a second metal different from the first metal, and the third silicide layer is substantially thicker than the fourth silicide layer.

20 Claims, 18 Drawing Sheets

(51) Int. Cl.

| | |
|---|---|
| ***H10D 30/62*** | (2025.01) |
| ***H10D 62/13*** | (2025.01) |
| ***H10D 62/85*** | (2025.01) |
| ***H10D 64/01*** | (2025.01) |
| ***H10D 64/66*** | (2025.01) |
| ***H10D 84/01*** | (2025.01) |
| ***H10D 84/03*** | (2025.01) |
| ***H10D 84/85*** | (2025.01) |

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 10,998,241 | B2 | 5/2021 | Khaderbad et al. | |
| 2016/0197074 | A1* | 7/2016 | Lee | H10D 30/60 257/369 |
| 2020/0091011 | A1* | 3/2020 | Khaderbad | H10D 84/017 |
| 2023/0361125 | A1* | 11/2023 | Khaderbad | H10D 62/83 |
| 2023/0402278 | A1* | 12/2023 | Tsai | H10D 30/6219 |

* cited by examiner 128
128
128
100
134
130
106
102
102P

X
Z

SEMICONDUCTOR DEVICE STRUCTURE AND METHODS OF FORMING THE SAME

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, FinFET devices use silicide to provide reduced electrical resistivity for contacts. Some conventional FinFET devices use the same silicide materials for both NFETs and PFETs, which does not optimize device performance. Other conventional FinFET devices employ extra masks and the associated additional fabrication steps to form different silicide materials for NFETs and PFETs. Using the extra masks and having to undergo the additional fabrication steps introduce additional complexity and cost into FinFET fabrication, which is also undesirable.

Therefore, although existing FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-10A are cross-sectional side views of various stages of manufacturing the semiconductor device structure of FIG. 4 taken along line A-A, in accordance with some embodiments.

FIGS. 5B-10B are cross-sectional side views of various stages of manufacturing the semiconductor device structure of FIG. 4 taken along line B-B, in accordance with some embodiments.

FIGS. 5C-10C are cross-sectional side views of various stages of manufacturing the semiconductor device structure of FIG. 4 taken along line C-C, in accordance with some embodiments.

DETAILED DESCRIPTION

Figure 1:
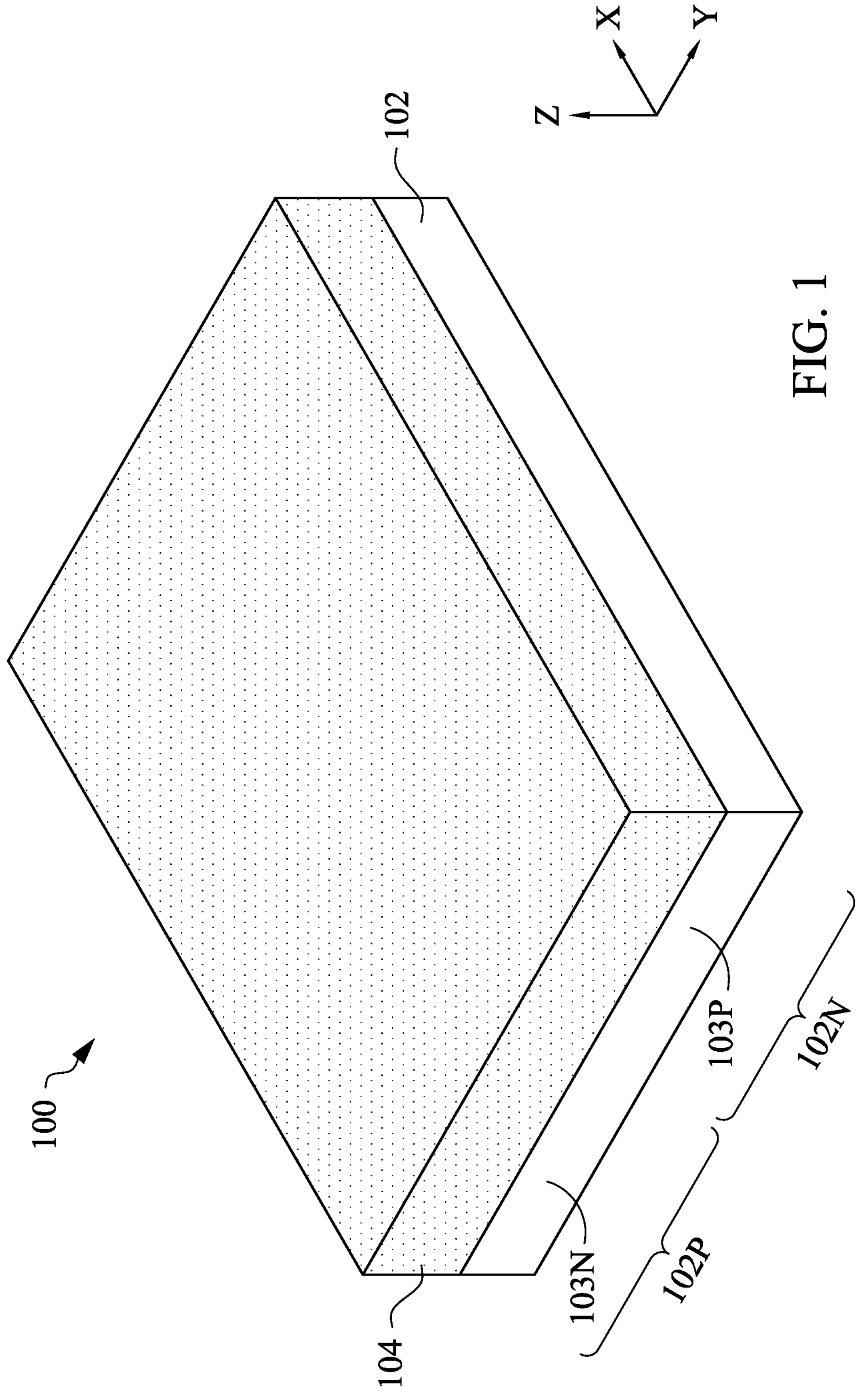
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a process flow to form NFET silicide and PFET silicide separately. One type of semiconductor device in which the processes of the present disclosure may be implemented may include FinFET devices. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET (PFET) device and an N-type metal-oxide-semiconductor (NMOS) FinFET (NFET) device. The following disclosure may use one or more FinFET examples to illustrate various embodiments of the present disclosure, but it is understood that the application is not limited to the FinFET device, except as specifically claimed.

FIGS. 1-11E illustrate various stages of manufacturing a semiconductor device structure 100 in accordance with various embodiments of this disclosure. It is understood that additional operations can be provided before, during, and after processes shown by FIGS. 1-11E and some of the operations described below can be replaced or eliminated, for additional embodiments of the method. The order of the operations/processes may be interchangeable.

FIGS. 1-4 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. While not shown in scale in some figures, the PMOS region 102P and NMOS region 102N belong to a continuous substrate 102. In some embodiments of the present disclosure, the PMOS region 102P is used to form a PMOS structure thereon, such as PFETs, whereas the NMOS region 102N is used to form an NMOS structure thereon, such as NFETs. In some embodiments, an N-well region 103N and a P-well region 103P are formed in the substrate 102, as shown in FIG. 1. For example, the N-well region 103N is formed in the substrate 102 in the PMOS region 102P, whereas the P-well region 103P is formed in the substrate 102 in the NMOS region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
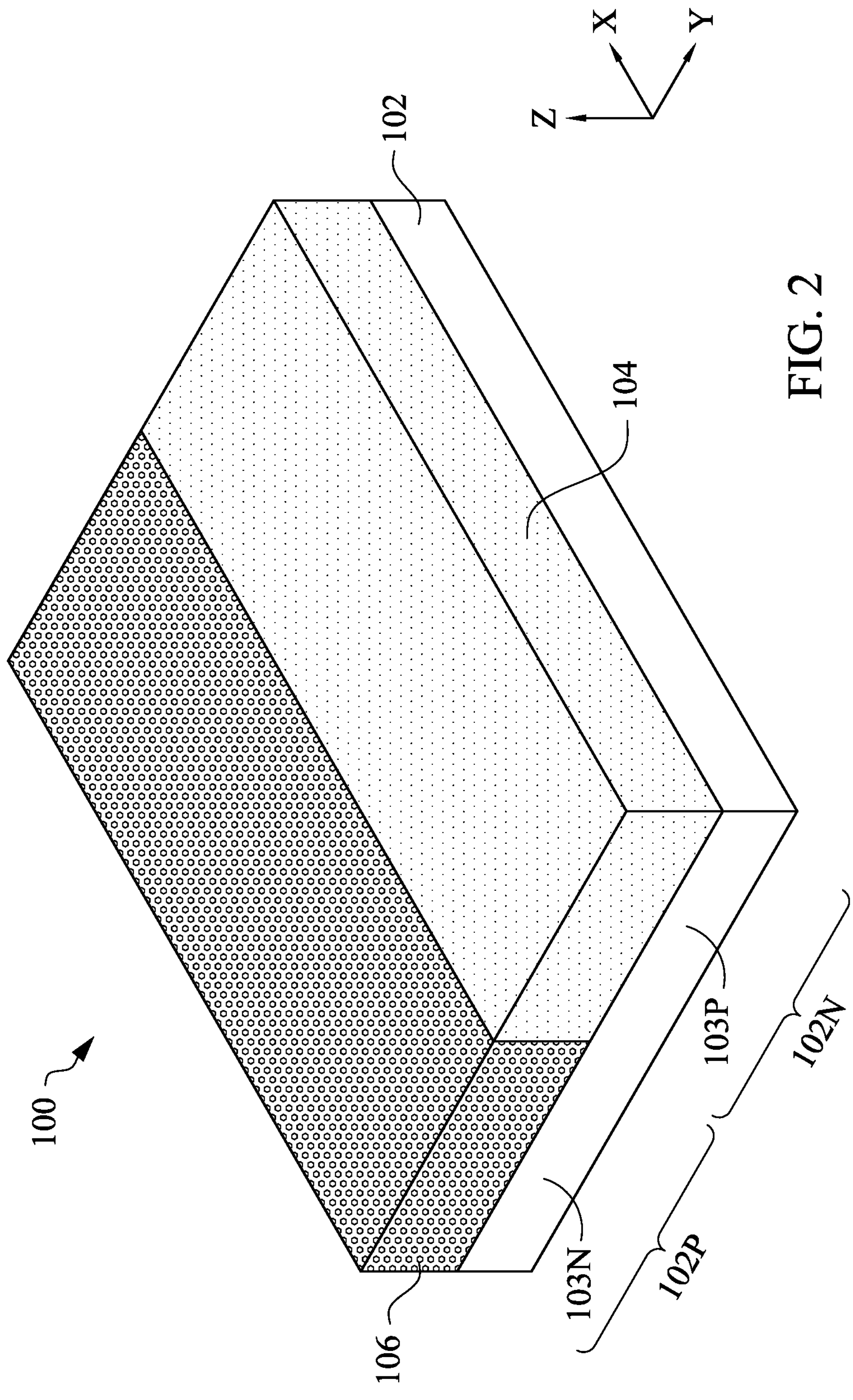

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P.

Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. While embodiments described in this disclosure are described in the context of FinFETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, and other suitable devices.

Figure 3:
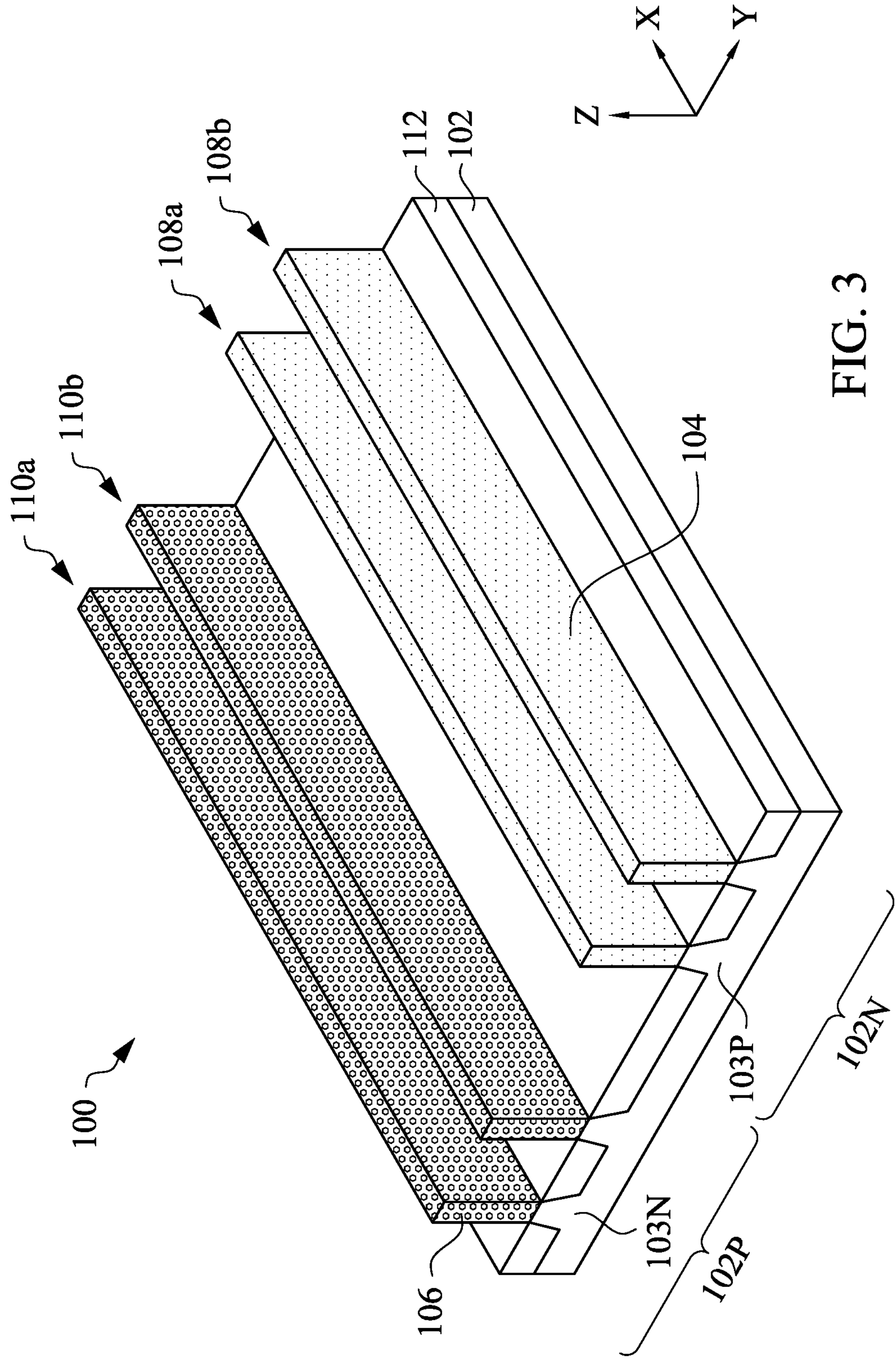

In FIG. 3, a plurality of fins 108*a*, 108*b*, 110*a*, 110*b* are formed from the first and second semiconductor layers 104, 106, respectively. The fins 108*a*, 108*b*, 110*a*, 110*b* may be patterned by any suitable method. For example, the fins 108*a*, 108*b*, 110*a*, 110*b* may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108*a*, 108*b* may each include the first semiconductor layer 104, and a portion of the first semiconductor layer 104 may serve as an NMOS channel. Each fin 108*a*, 108*b* may also include the P-well region 103P. Likewise, the fins 110*a*, 110*b* may each include the second semiconductor layer 106, and a portion of the second semiconductor layer 106 may serve as a PMOS channel. Each fin 110*a*, 110*b* may also include the N-well region 103N. A mask (not shown) may be formed on the first and second semiconductor layers 104, 106, and may remain on the fins 108*a-b* and 110*a-b*.

Next, an insulating structure 112 is formed between adjacent fins 108*a-b*, 110*a-b*. The insulating structure 112 may be first formed between adjacent fins 108*a-b*, 110*a-b* and over the fins 108*a-b*, 110*a-b*, so the fins 108*a-b*, 110*a-b* are embedded in the insulating structure 112. The insulating structure 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating structure 112 may be formed by any suitable method, such as low-pressure chemical vapor deposition (LPCVD), plasma enhanced CVD (PECVD) or flowable CVD (FCVD).

Next, a planarization process, such as a chemical-mechanical polishing (CMP) process may be performed to expose the top of the fins 108*a*-*b*, 110*a*-*b*. In some embodiments, the planarization process exposes the top of the mask (not shown) disposed on the fins 108*a*-*b* and 110*a*-*b*. The insulating structure 112 is then recessed by removing portions of the insulating structure 112 located on both sides of each fin 108*a*-*b*, 110*a*-*b*. The recessed insulating structure 112 may be shallow trench isolation (STI) region.

Figure 4:
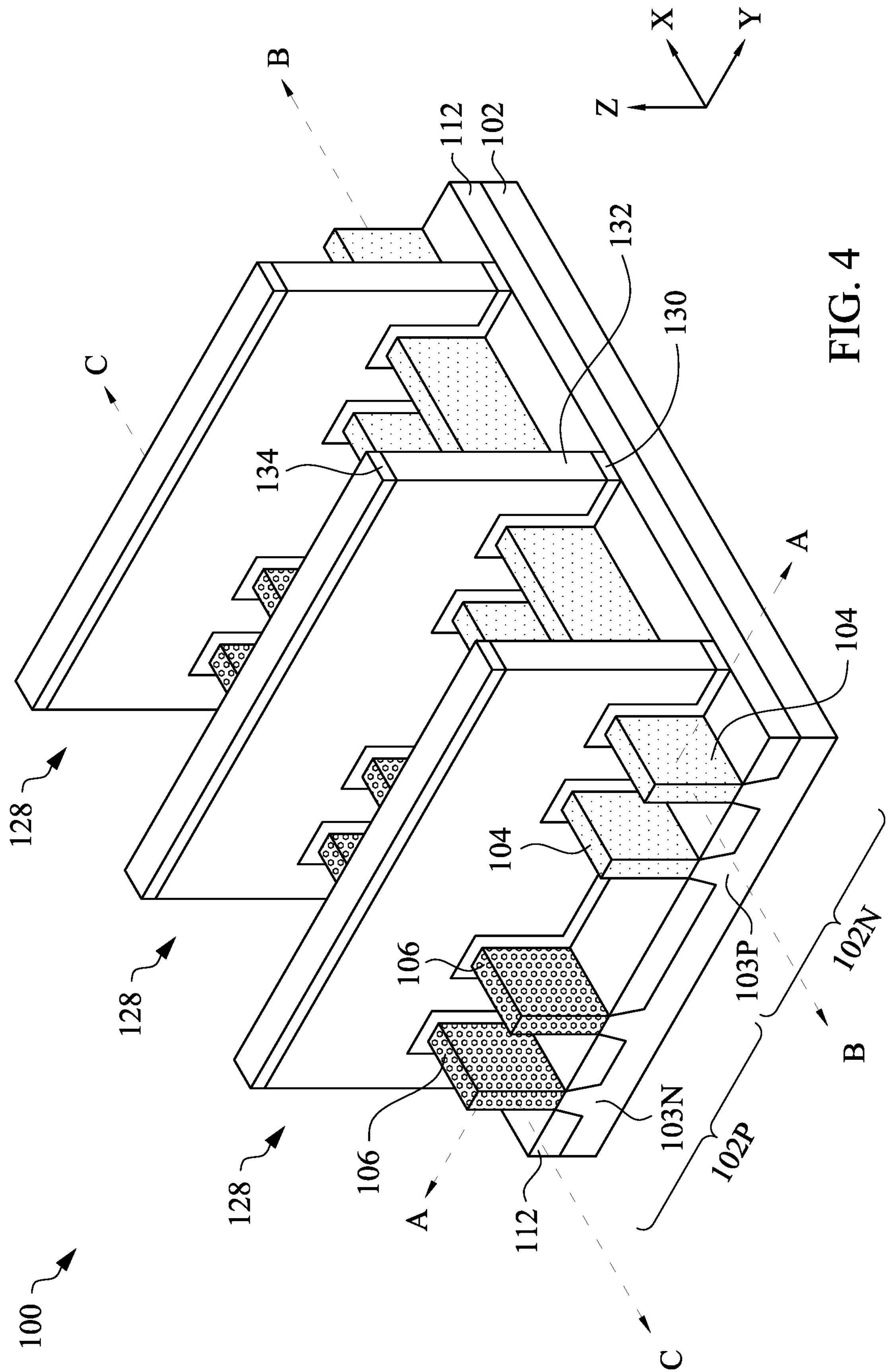

In FIG. 4, one or more sacrificial gate stacks 128 are formed on a portion of the fins 108*a*-*b*, 110*a*-*b*. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an atomic layer deposition (ALD) process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108*a*-*b*, 110*a*-*b* are partially exposed on opposite sides of the sacrificial gate stacks 128. Portions of the insulating structure 112 are exposed as a result of the etch process(s) to form the sacrificial gate stacks 128. While three sacrificial gate stacks 128 are shown in FIG. 4, it can be appreciated that they are for illustrative purpose only and any number of the sacrificial gate stacks 128 may be formed.

FIGS. 5A-10A are cross-sectional side views of various stages of manufacturing the semiconductor device structure 100 of FIG. 4 taken along line A-A, in accordance with some embodiments. FIGS. 5B-10B are cross-sectional side views of various stages of manufacturing the semiconductor device structure 100 of FIG. 4 taken along line B-B, in accordance with some embodiments. FIGS. 5C-10C are cross-sectional side views of various stages of manufacturing the semiconductor device structure 100 of FIG. 4 taken along line C-C, in accordance with some embodiments.

Figure 5B:
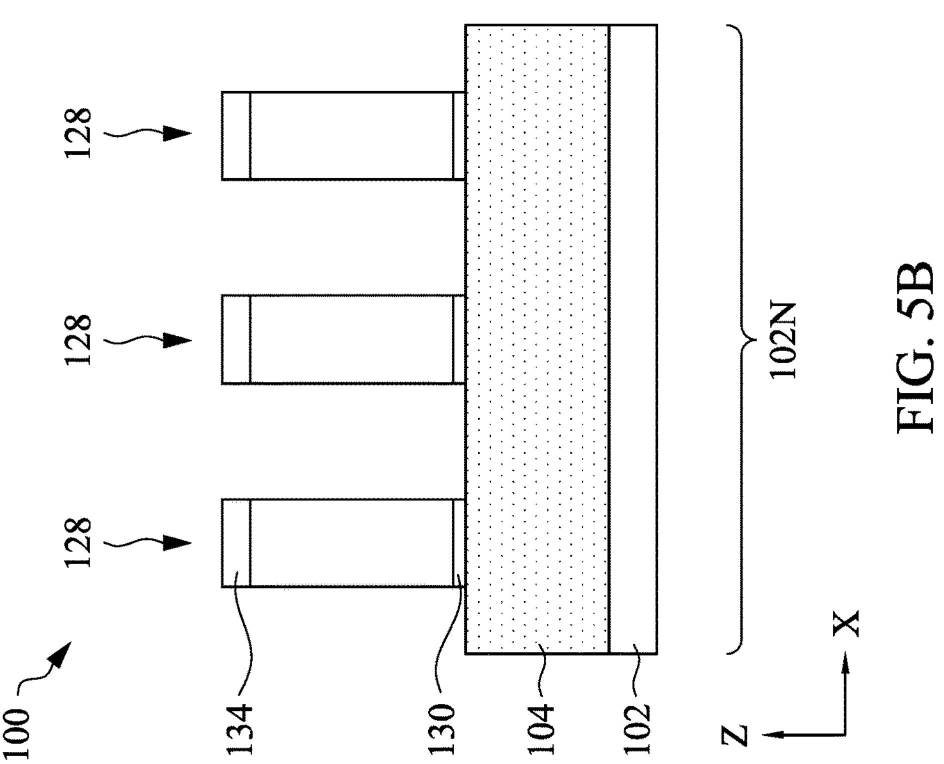
Figure 5A:
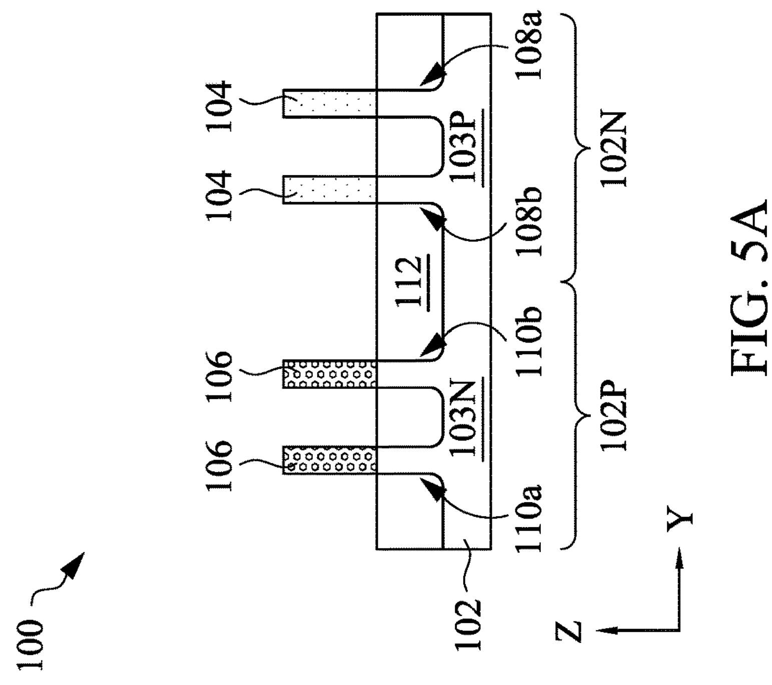
Figure 5C:
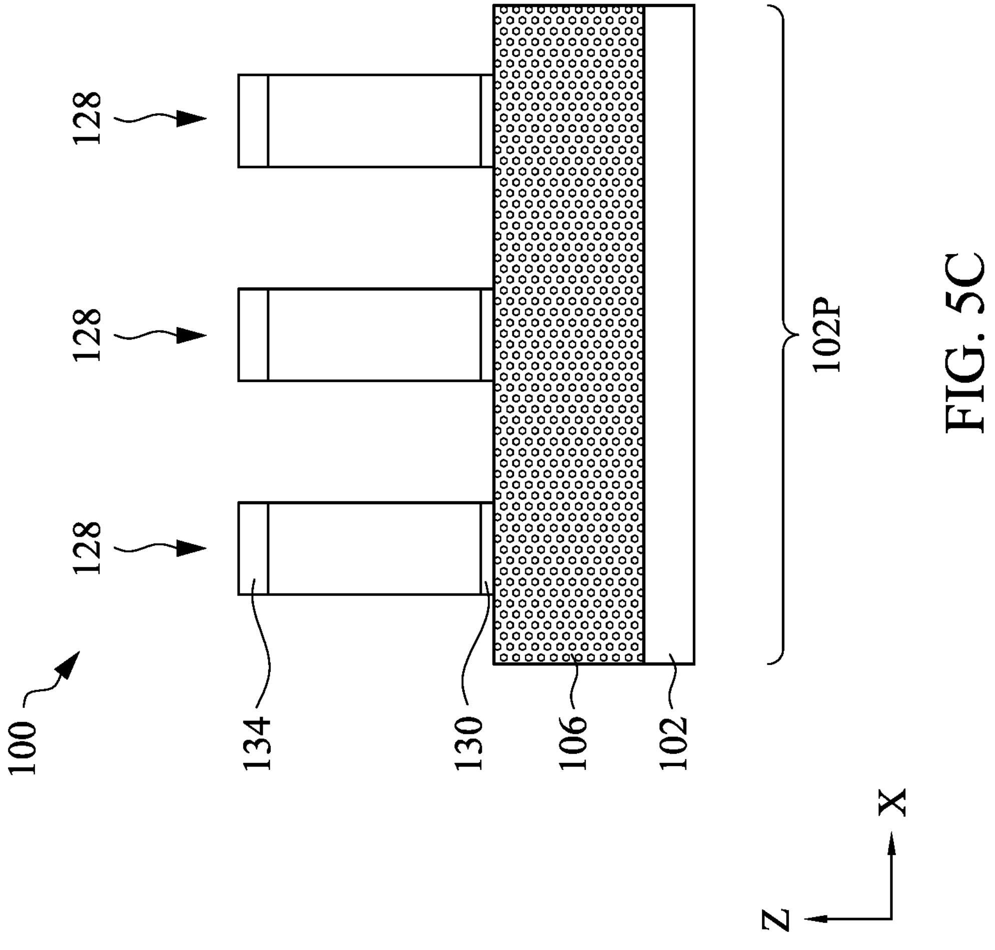
Figure 6B:
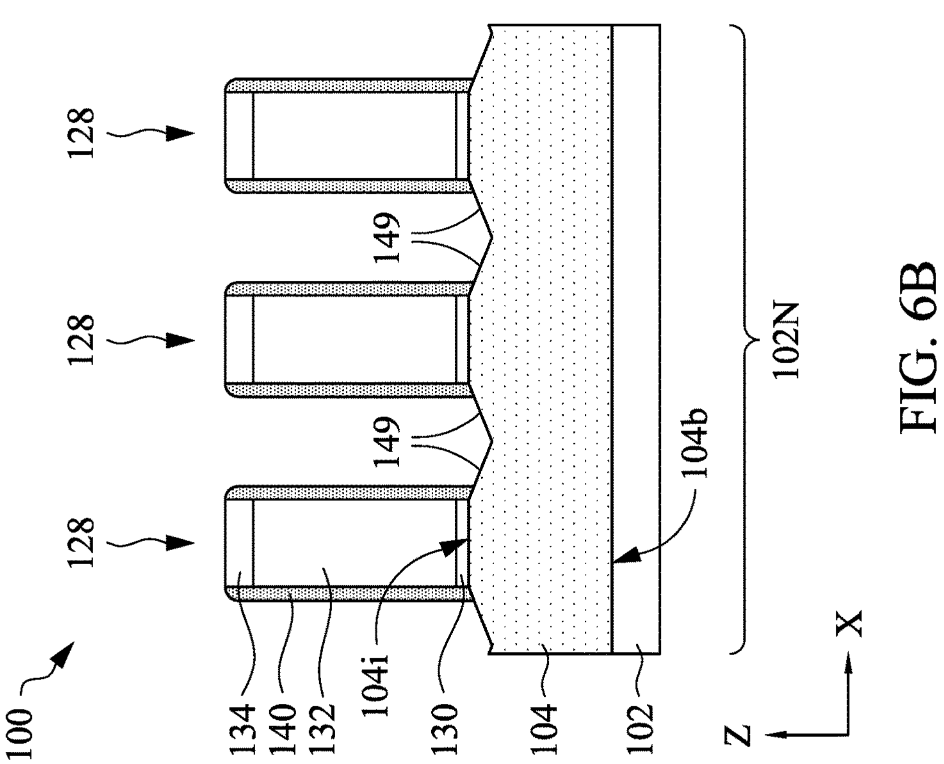
Figure 6A:
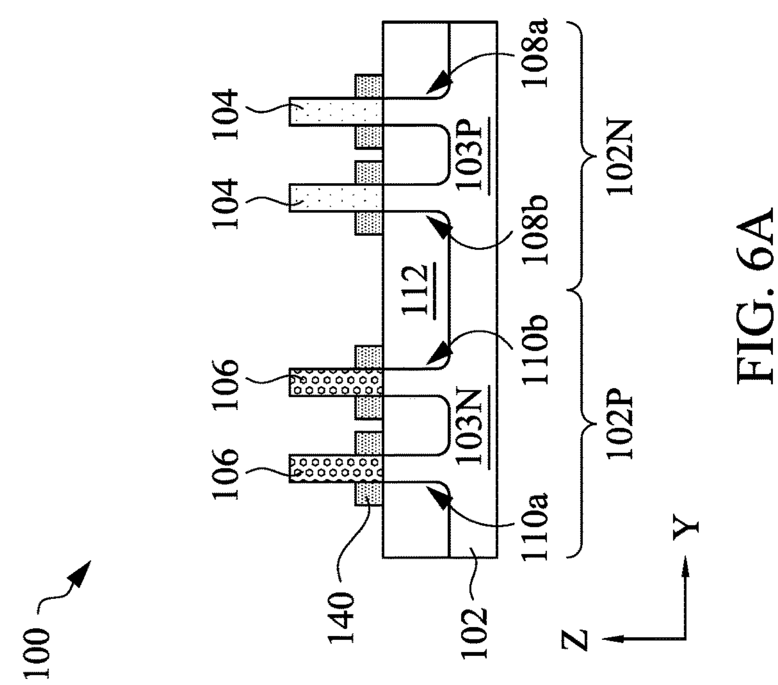
Figure 6C:
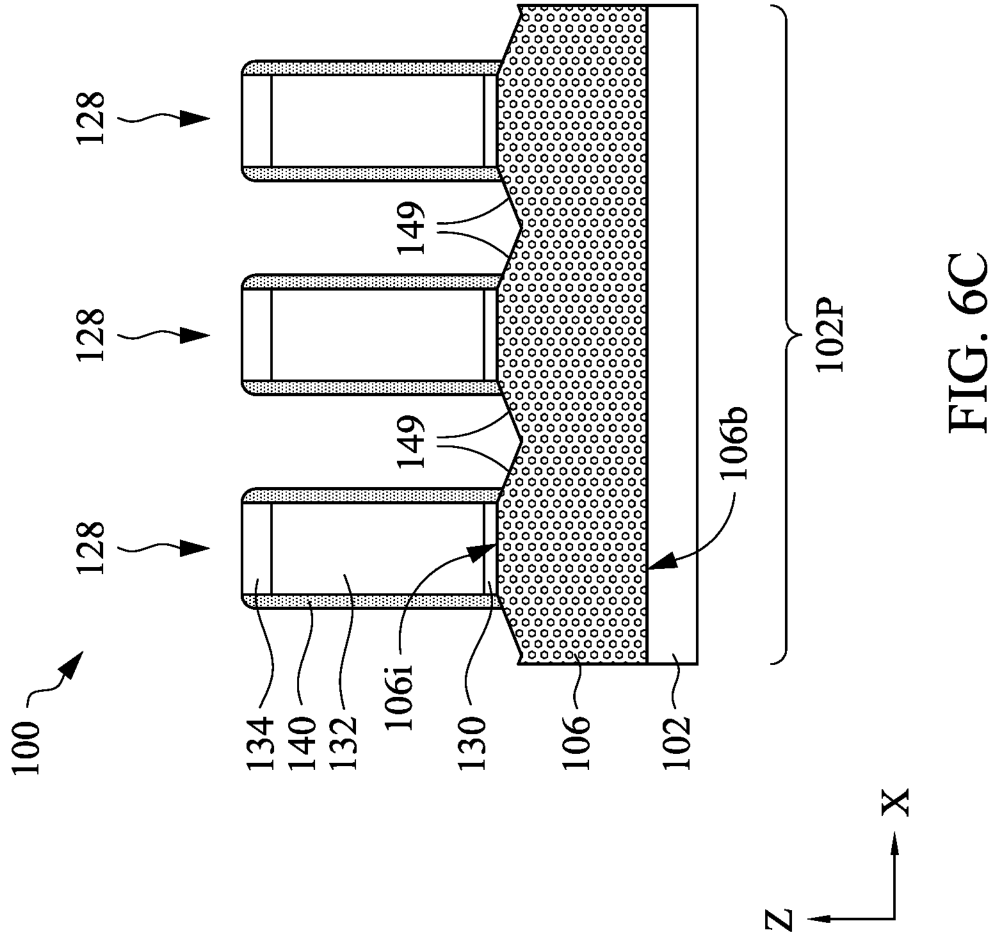

FIGS. 5A-5C illustrate a stage after the sacrificial gate stacks 128 are formed on a portion of the fins 108*a*-*b*, 110*a*-*b*. In FIGS. 6A-6C, a spacer 140 is formed on the sacrificial gate stacks 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. An anisotropic etch is then performed on the spacer 140 using, for example, RIE. During the anisotropic etch process, most of the spacer 140 is removed from horizontal surfaces, such as tops of the sacrificial gate stacks 128 and tops of the fins 108*a*-*b*, 110*a*-*b*, leaving the spacer 140 on the vertical surfaces, such as on opposite sidewalls of the sacrificial gate stacks 128. The spacers 140 may partially remain on opposite sidewalls of the fins 108*a*-*b*, 110*a*-*b*, as shown in FIG. 6A. In some embodiments, the spacers 140 formed on the source/drain regions of the fins 108*a*-*b*, 110*a*-*b* are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed above.

In various embodiments where the spacer 140 includes multiple layers, the top portion of the fins 108*a*-*b*, 110*a*-*b* not covered by the sacrificial gate stacks 128 may have a taper profile 149, as shown in FIGS. 6B, 6C. The taper profile 149 may be formed as a result of multiple exposure of the first and second semiconductor layers 104, 106 to etchants used during formation of the spacer 140. The taper profile 149 between adjacent sacrificial gate stacks 128 forms a shallow V-shaped top surface in the first and second semiconductor layers 104, 106, respectively.

Figure 7B:
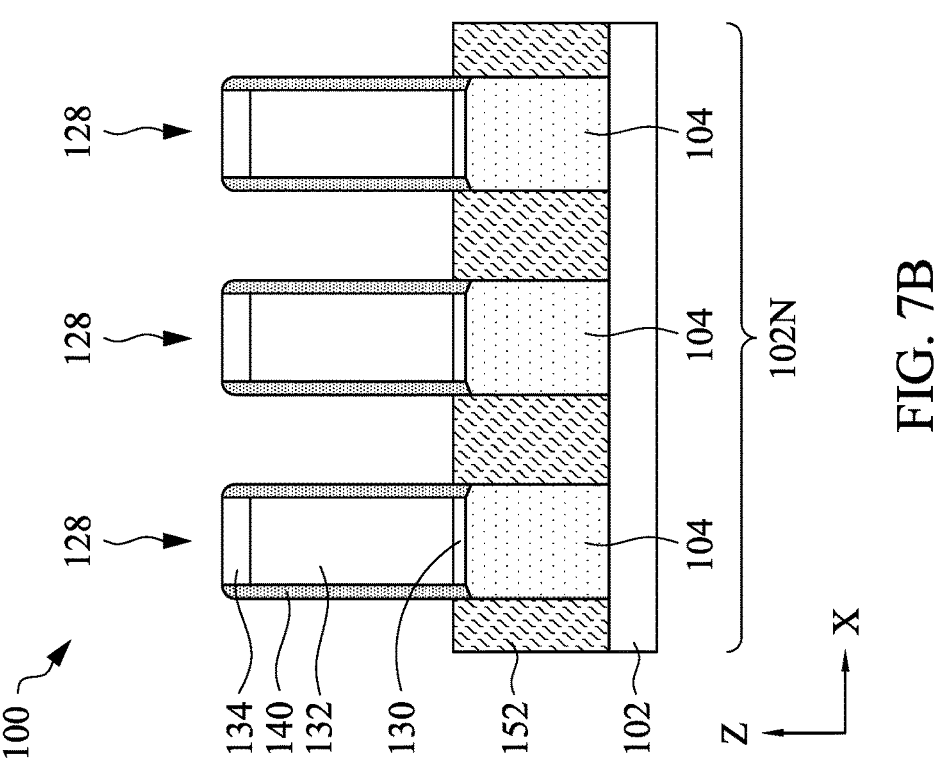
Figure 7A:
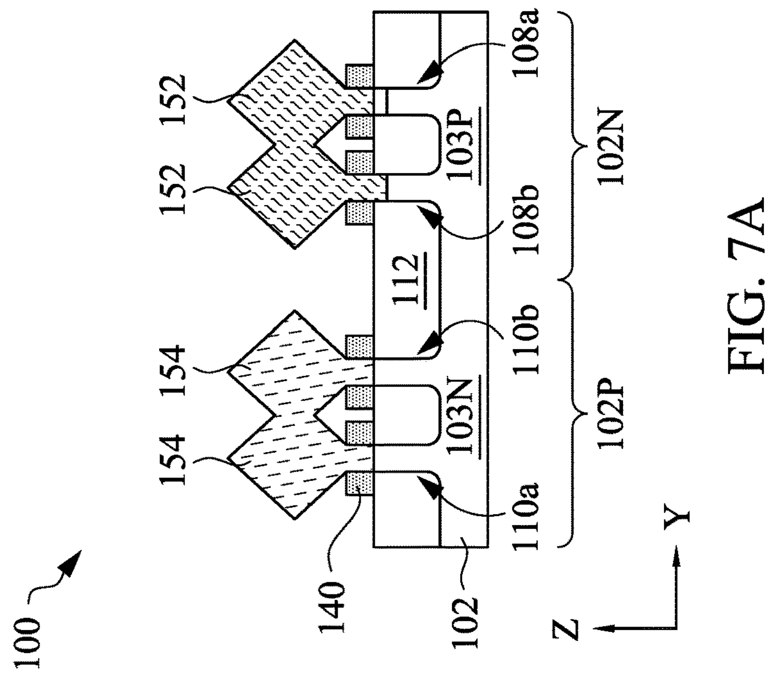
Figure 7C:
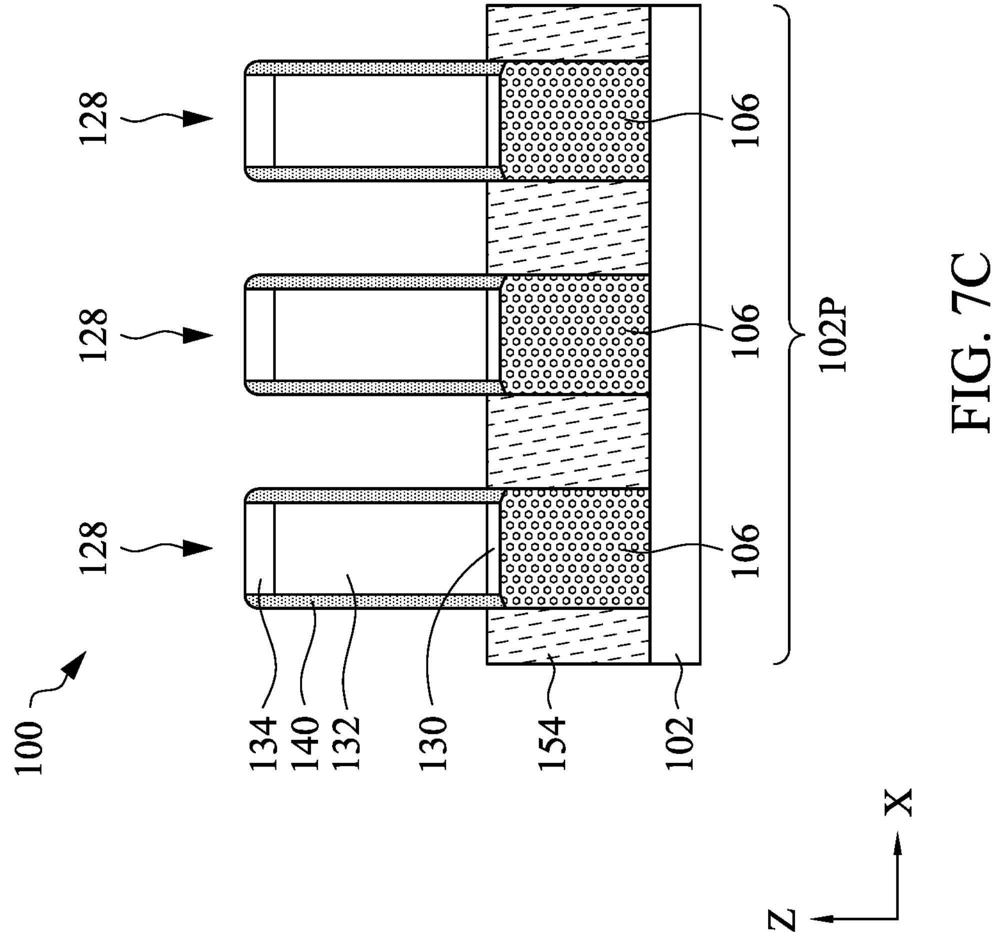

In FIGS. 7A-7C, the first and second semiconductor layers 104, 106 of the fins 108*a*-*b*, 110*a*-*b* not covered by the sacrificial gate stacks 128 and the spacers 140 are recessed, and source/drain (S/D) epitaxial features 152, 154 are formed. The S/D epitaxial features 152, 154 may be S/D regions. In this disclosure, a source region and a drain region are interchangeably used, and the structures thereof are substantially the same. Furthermore, source/drain region(s) may refer to a source or a drain, individually or collectively dependent upon the context. The etchant for recessing of the first and second semiconductor layers 104. 106 is selected so different materials have different etch rates. For example, the first semiconductor layer 104 of the fins 108*a*-*b* may have a first etch rate by the etchant, and the second semiconductor layer 106 of the fins 110*a*-*b* may have a second etch rate by the etchant. In the embodiments where the first semiconductor layer 104 in the NMOS region 102N and the second semiconductor layer 106 in the PMOS region 102P each includes different materials (e.g., first semiconductor layer 104 in the NMOS region 102N is SiGe and second semiconductor layer 106 in the PMOS region 102P is Si), the first etch rate is faster than the second etch rate. A portion of the P-well region 103P of the fins 108*a*-*b* can be slightly etched before the second semiconductor layer 106 in the PMOS region 102P is fully etched away. As a result, a top surface 109 of the fins 108*a*-*b* at the NMOS region 102N is at a level below a top surface 111 of the fins 110*a*-*b* at the PMOS region 102P, resulting in a deeper S/D junction depth in the NMOS region 102N than that of the PMOS region 102P. While not shown, it is contemplated that such a difference between the top surface 109 and the top surface 111 is applicable to various embodiments of this disclosure.

For devices in the NMOS region 102N, each S/D epitaxial feature 152 may be N-type S/D epitaxial feature and may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the exposed surface of the fins 108*a-b* on both sides of each sacrificial gate stack 128, as shown in FIG. 7B. In some embodiments, the portions of the first semiconductor layer 104 on both sides of each sacrificial gate stack 128 are completely removed, and the S/D epitaxial features 152 are formed on the P-well region 103P of the fins 108*a-b*. The S/D epitaxial features 152 may grow both vertically and horizontally to form facets, which may correspond to crystalline planes of the material used for the substrate 102. In some embodiments, the S/D epitaxial features 152 formed on the P-well region 103P of the fins 108*a* and 108*b* are merged, as shown in FIG. 7A. The S/D epitaxial features 152 may each have a top surface at a level higher than a top surface of the first semiconductor layer 104, as shown in FIG. 7B.

For devices in the PMOS region 102P, each S/D epitaxial feature 154 may be P-type S/D epitaxial feature and may include one or more layers of Si, SiGe, SiGeB, Ge, or a group III-V material (InSb, GaSb, InGaSb), and each layer may have a different silicon or germanium concentration. Each S/D epitaxial feature 154 may include P-type dopants, such as boron (B) or other suitable P-type dopants. In some embodiments, the S/D epitaxial features 152 in the NMOS region 102N are Si and the S/D epitaxial features 154 in the PMOS region 102P are SiGe. The S/D epitaxial features 154 may be formed by any suitable method, such as CVD, CVD epitaxy, MBE, or other suitable method. In some embodiments, the portions of the second semiconductor layer 106 on both sides of each sacrificial gate stack 128 are completely removed, and the S/D epitaxial features 154 are formed on the N-well region 103N of the fins 110*a-b*. The S/D epitaxial features 154 may grow both vertically and horizontally to form facets, which may correspond to crystalline planes of the material used for the substrate 102. In some embodiments, the S/D epitaxial features 154 formed on the N-well region 103N of the fins 110*a* and 110*b* are merged, as shown in FIG. 7A. The S/D epitaxial features 154 may each have a top surface at a level higher than a top surface of the second semiconductor layer 106, as shown in FIG. 7C.

Figure 8B:
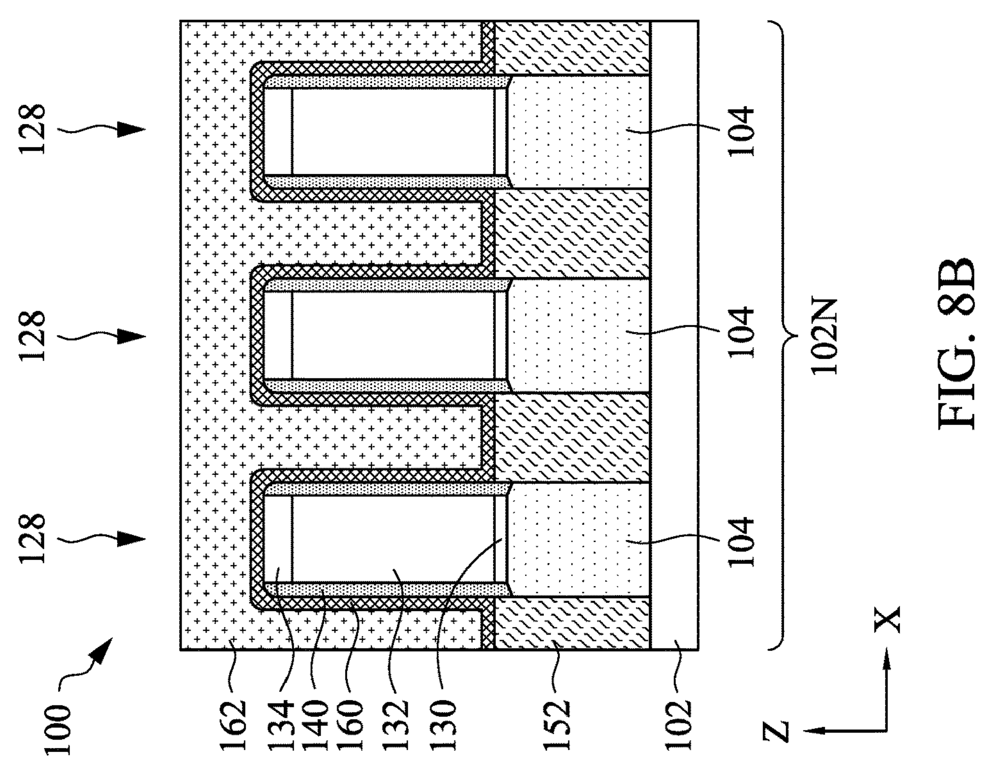
Figure 8A:
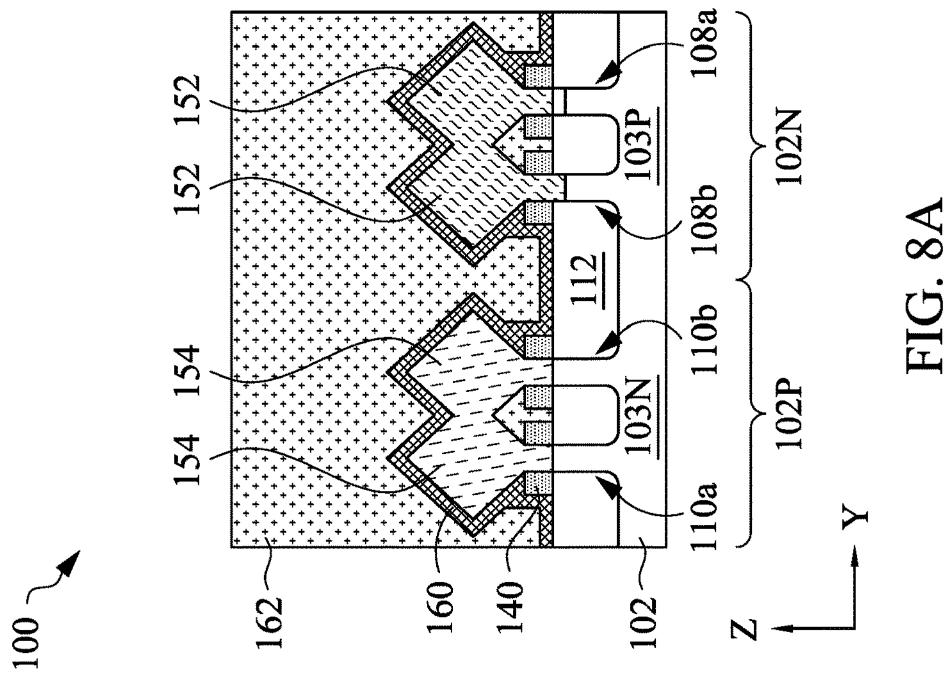
Figure 8C:
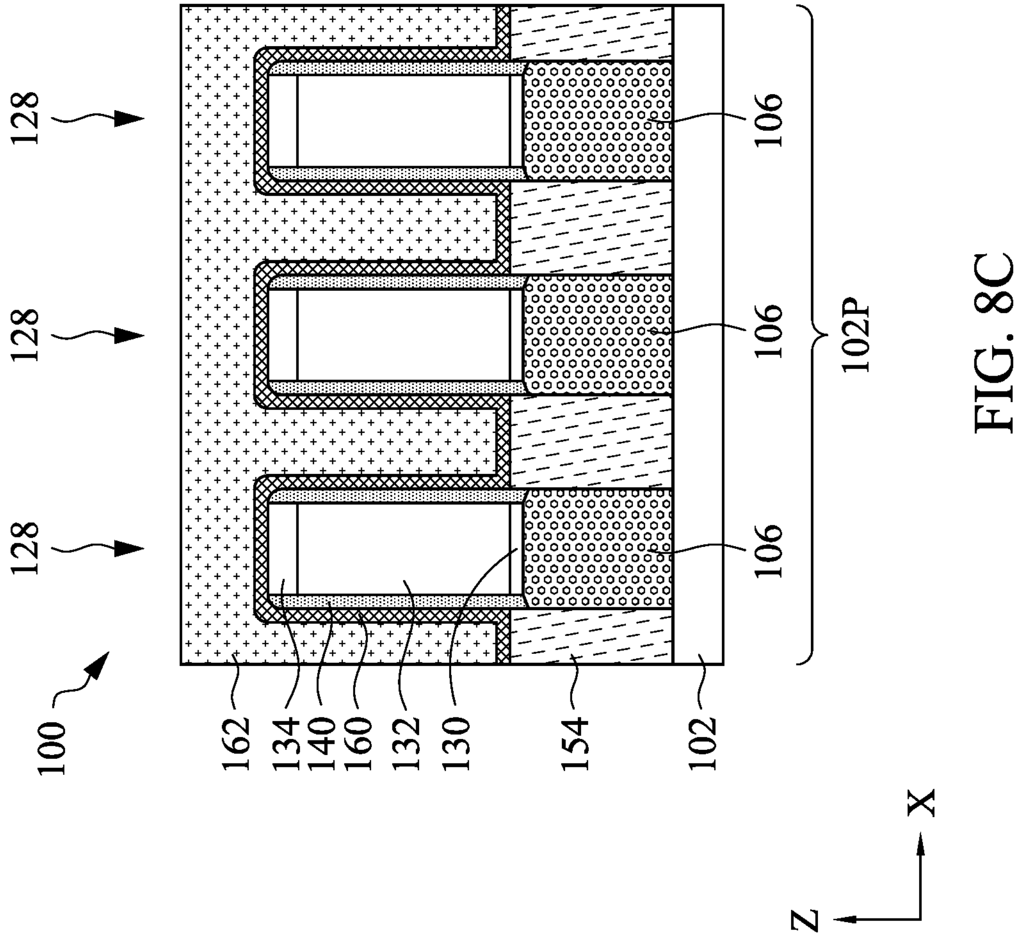

In FIGS. 8A-8C, a contact etch stop layer (CESL) 160 is conformally formed on the exposed surfaces of the semiconductor device structure 100. The CESL 160 covers the sidewalls of the sacrificial gate stacks 128, the insulating structure 112, and the S/D epitaxial features 152, 154. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique.

Next, an interlayer dielectric (ILD) layer 162 is formed on the CESL 160. The materials for the ILD layer 162 may include compounds comprising Si, O, C, and/or H, such as SiOCH, oxide formed using tetraethylorthosilicate (TEOS), un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique.

After the formation of the ILD layer 162, a planarization process is performed to expose the sacrificial gate electrode layer 132. The planarization process may be any suitable process, such as a CMP process. The planarization process removes portions of the ILD layer 162 and the CESL 160 disposed on the sacrificial gate stacks 128. The planarization process may also remove the mask structure 134.

Figure 9B:
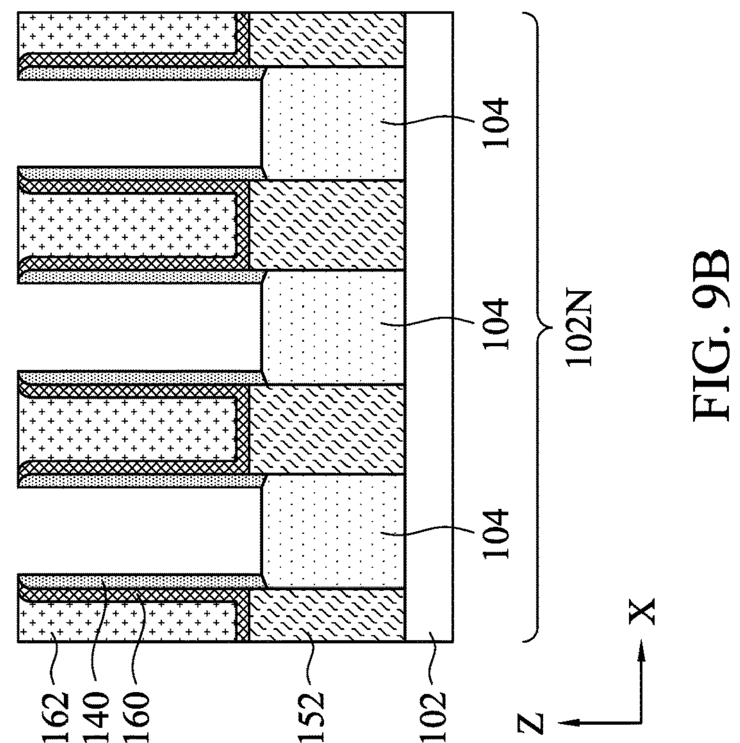
Figure 9A:
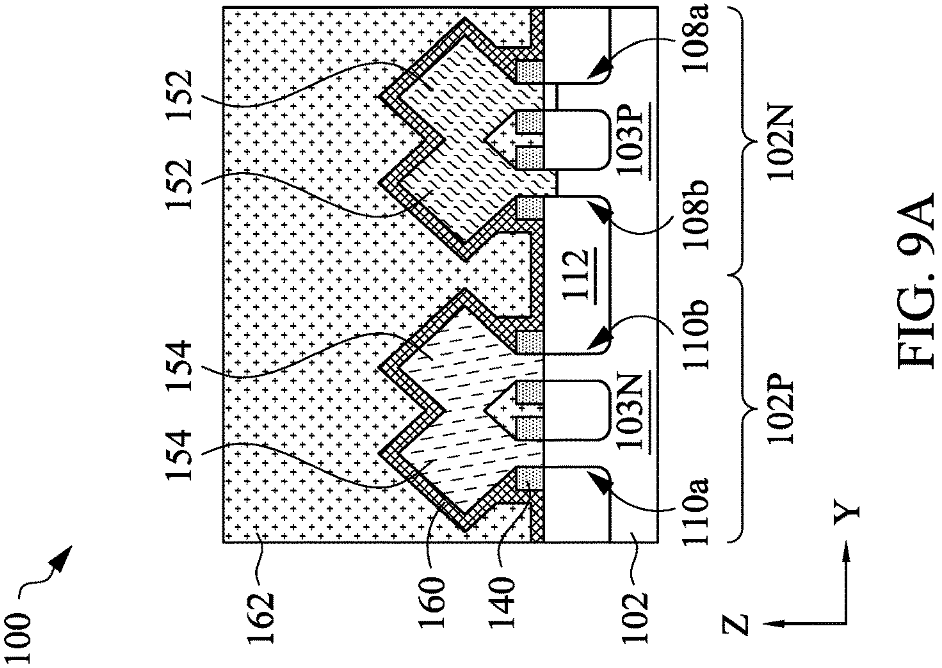
Figure 9C:
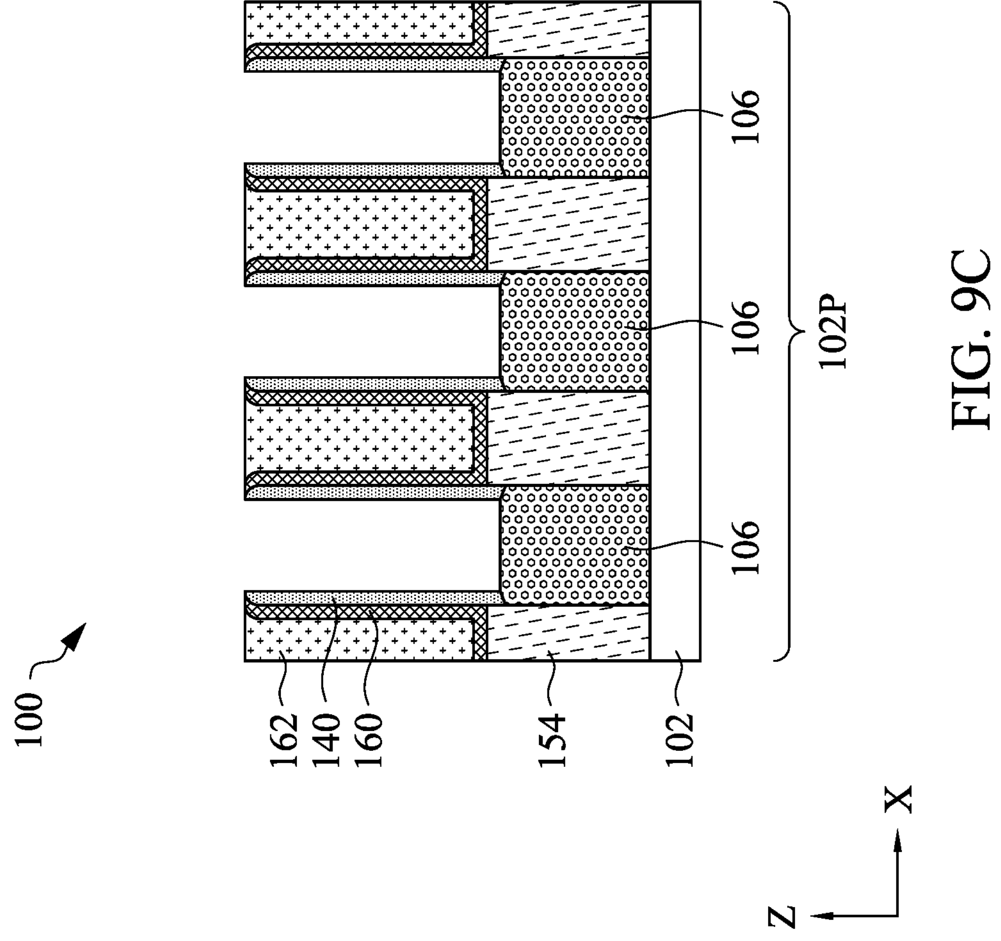

In FIGS. 9A-9C, the mask structure 134 (if not removed during CMP process), the sacrificial gate electrode layers 132 (FIG. 8B), and the sacrificial gate dielectric layers 130 (FIG. 8B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the ILD layer 162. The removal of the sacrificial gate electrode layers 132 and the sacrificial gate dielectric layers 130 exposes a top portion of the first and second semiconductor layers 104, 106 in the channel region.

Figure 10B:
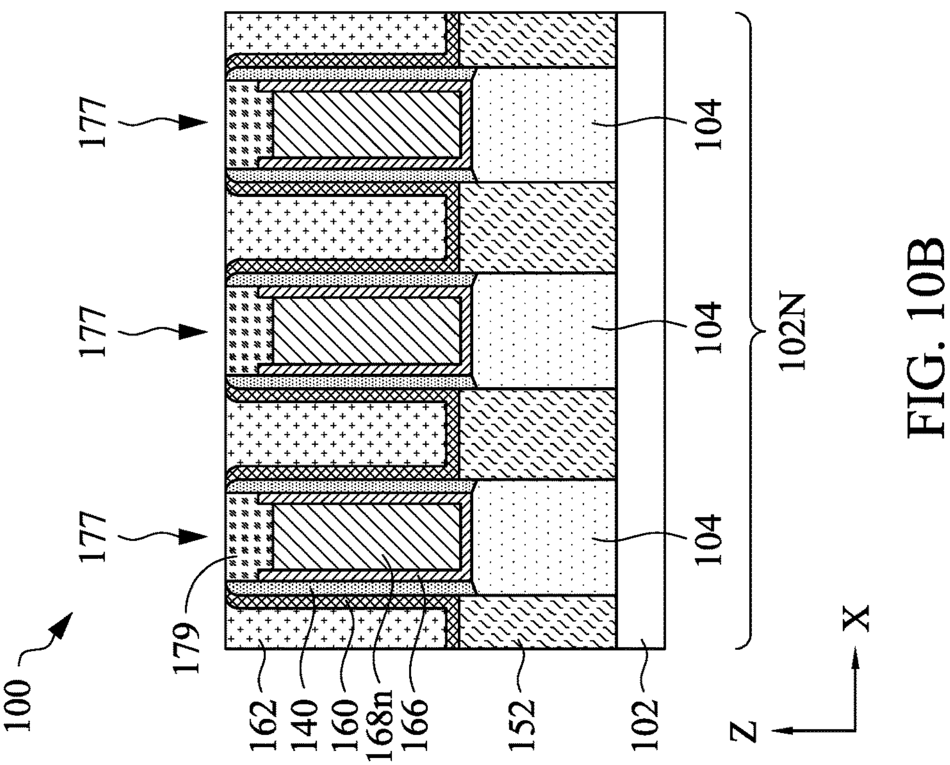
Figure 10A:
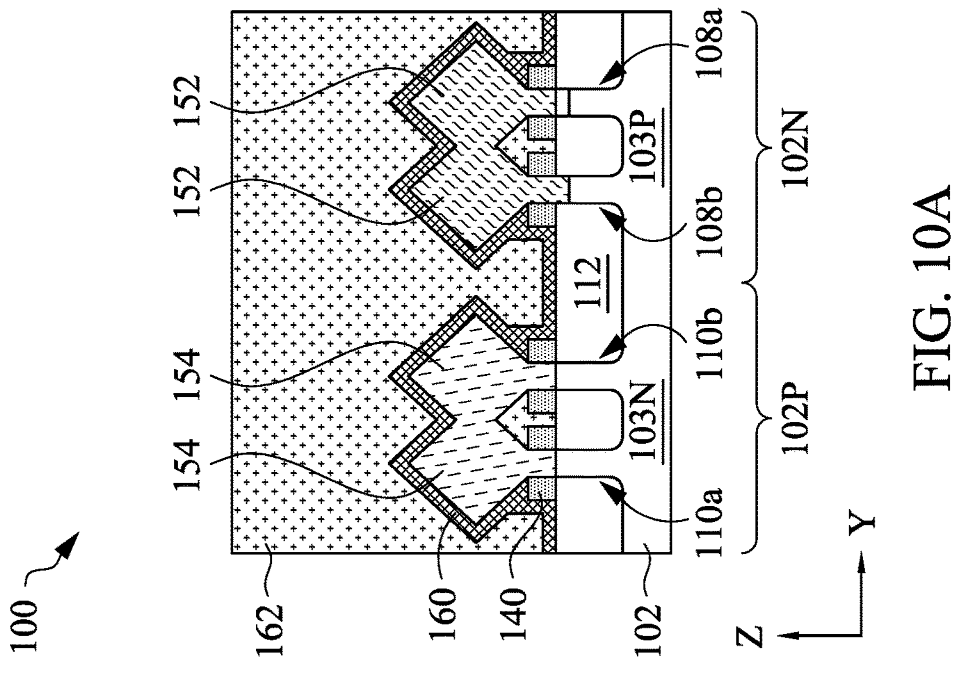
Figure 10C:
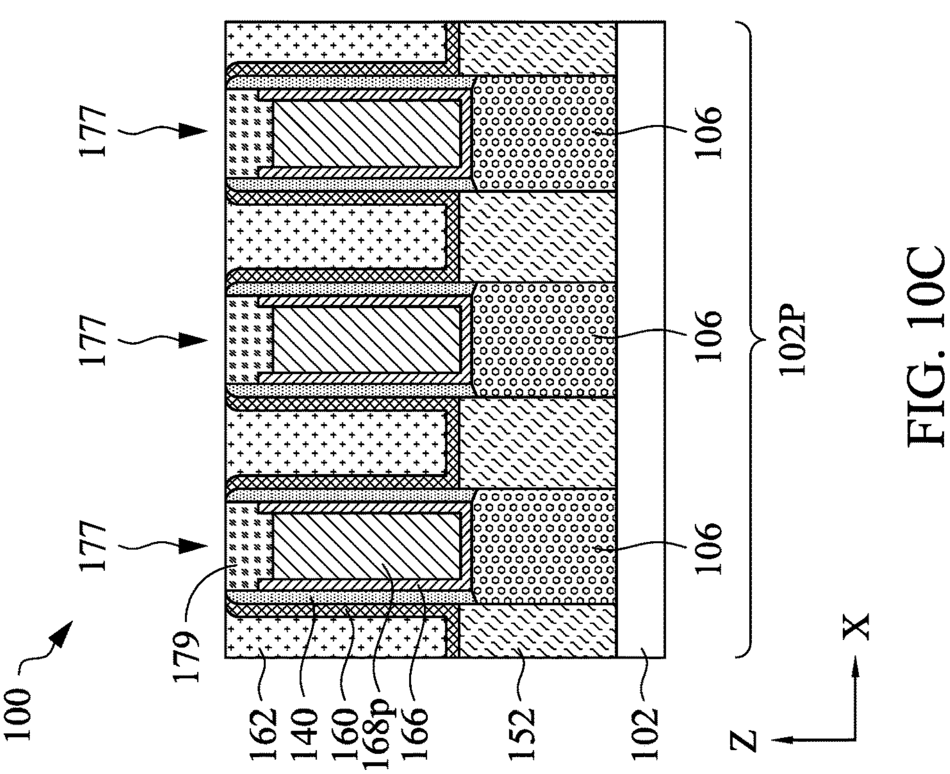

In FIGS. 10A-10C, replacement gate structures 177 are formed. The replacement gate structure 177 may include a gate dielectric layer 166 and a gate electrode layer 168*p*, 168*n* formed on the gate dielectric layer 166. As can be seen in FIGS. 10B and 10C, the gate dielectric layer 166 is formed on the first and second semiconductor layers 104, 106. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168*p*, 186*n* may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or combinations thereof. For devices in the NMOS region 102N, the gate electrode layer 168*n* may be AlTiO. AlTiC, or a combination thereof. For devices in the PMOS region 102P, the gate electrode layer 168*p* may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168*p*, 168*n*. The MGEB process may be a plasma etching process employing one or more etchants such as chlorine-containing gas, a bromine-containing gas, and/or a fluorine-containing gas. After the MGEB process, a top surface of the gate electrode layer 168*p*, 168*n* may be lower than a top surface of the gate dielectric layer 166. In some embodiments, portions of the spacers 140 are etched back so that the top surface of the spacers 140 is higher than the top surfaces of the gate dielectric layer 166 and the gate electrode layer 168*p*, 168*n*.

Then, trenches formed above the gate dielectric layer 166 and the gate electrode layer 168*p*, 168*n* as a result of the MGEB processes are filled with a self-aligned contact (SAC) layer 179. The SAC layer 179 can be formed of any dielectric material that has different etch selectivity than the CESL 160 and the ILD layer 162. A CMP process is then performed to remove excess deposition of the SAC layer 179 until the top surface of the ILD layer 162 is exposed.

Figure 11A:
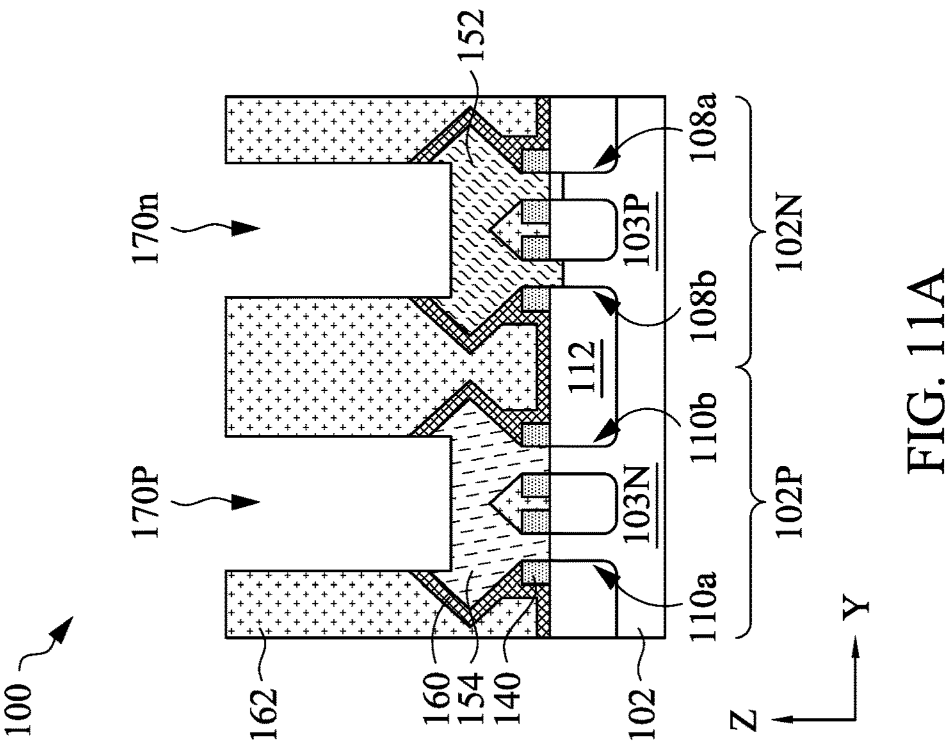
FIGS. 11A-11E are cross-sectional side views of various stages of manufacturing the semiconductor device structure of FIG. 4 taken along line A-A, in accordance with some embodiments.

FIGS. 11A-11E are cross-sectional side views of various stages of manufacturing the semiconductor device structure of FIG. 4 taken along line A-A, in accordance with some embodiments. As shown in FIG. 11A, portions of the ILD layer 162 and the CESL 160 disposed on both sides of the replacement gate structures 177 are removed. The removal of the portions of the ILD layer 162 and the CESL 160 forms contact openings 170*n*, 170*p* exposing the S/D epitaxial features 152, 154, respectively. In some embodiments, the upper portion of the exposed S/D epitaxial features 152, 154 is removed.

In some embodiments, a single silicide layer is formed on the exposed S/D epitaxial features 152, 154. However, the intrinsic thermionic barrier will be preferential to either N-type or P-type S/D epitaxial feature due to the single metal silicide. As a result, parasitic resistance may be high. In some embodiments, dual silicide layers (one silicide layer for the N-type S/D epitaxial feature and a different silicide layer for the P-type S/D epitaxial feature) may be utilized. However, the dual silicide layers are formed by a process using a block layer and with significant patterning and etching, which can degrade the integrity of the dual silicide layers.

To overcome the problems discussed above, the present disclosure utilizes a fabrication process flow to selectively form different types of metal silicide layers for PFETs and NFETs, without requiring extra lithography masks and the accompanying extra lithography steps. Furthermore, the process does not require a blocking layer. Advantageously, the fabrication processes of the present disclosure can achieve one type of metal silicide layers for PFETs, and another type of metal silicide layers for NFETs (referred to as dual silicide layers). For example, the different types of metal silicide materials are grown selectively over the source/drains for PFETs and NFETs. As a result, electrical resistivity for contacts is reduced.

Figure 11C:
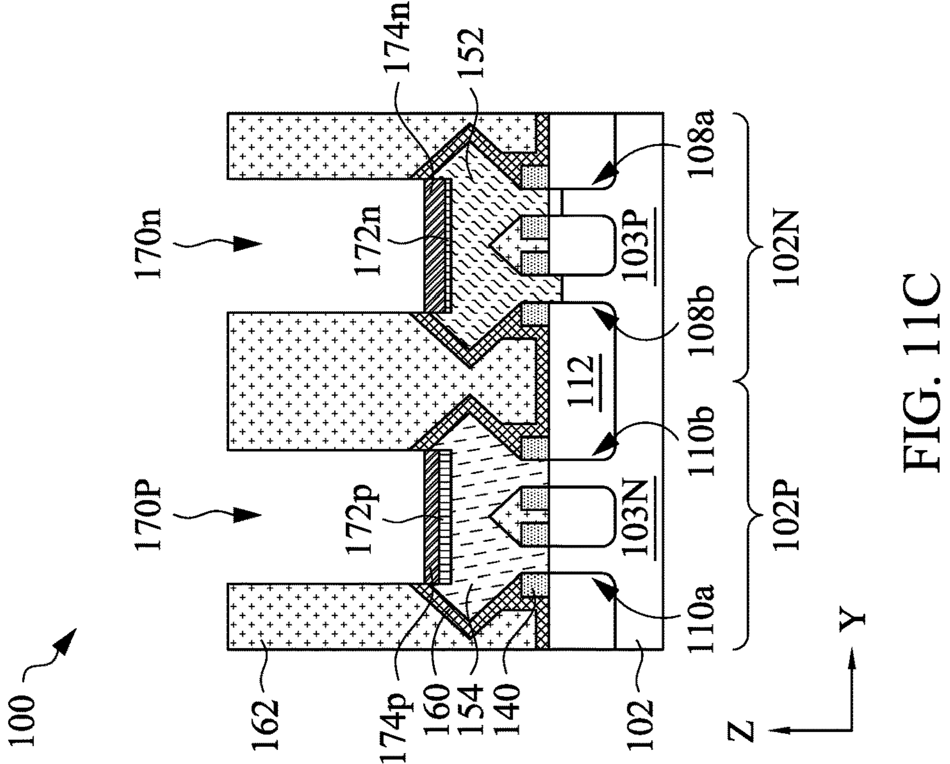
Figure 11B:
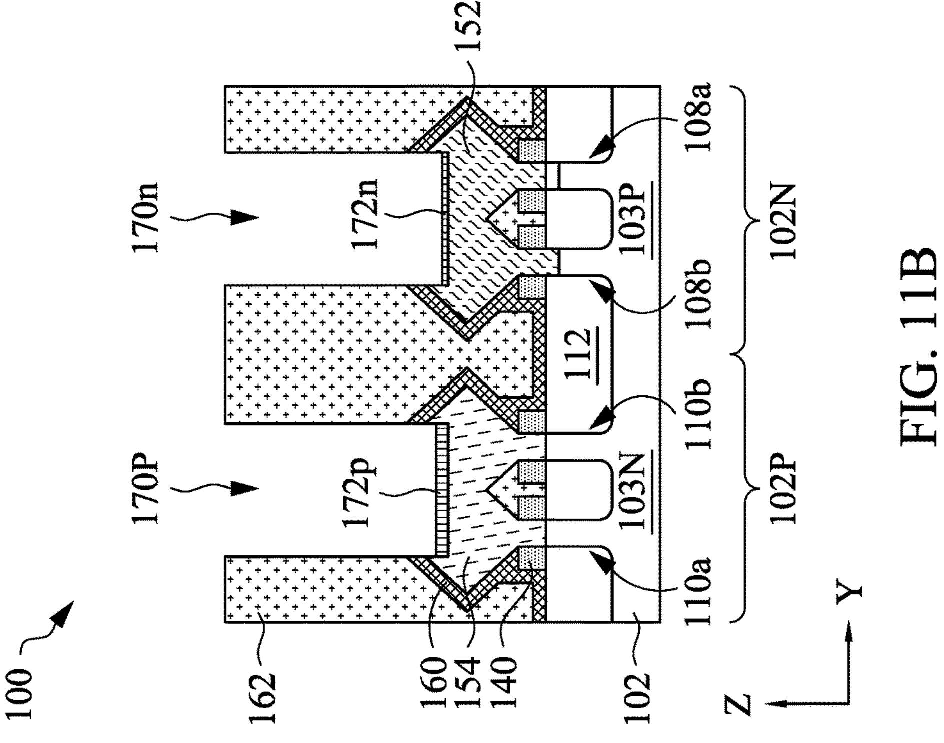

As shown in FIG. 11B, silicide layers 172*n*, 172*p* are selectively formed on the exposed portions of the S/D epitaxial features 152, 154, respectively. Prior to forming the silicide layers 172*n*, 172*p*, the exposed S/D epitaxial features 152, 154 may be oxidized, and a clean process may be performed to remove the oxidized portions of the S/D epitaxial features 152, 154. The clean process may be plasma based or chemical based. After the clean process, without breaking vacuum, the silicide layers 172*n*, 172*p* are formed. The silicide layers 172*n*, 172*p* are not formed on the dielectric material of the ILD layer 162.

In some embodiments, the silicide layers 172*n*, 172*p* are formed by an in-situ selective ALD process. The ALD process includes flowing a first precursor into a processing chamber, forming a monolayer on the surfaces of the exposed portions of the S/D epitaxial features 152, 154, flowing a second precursor into the processing chamber to react with the monolayer, and repeating the flowing of the first and second precursors into the processing chamber. In some embodiments, the first precursor is $MoCl_5$, and the process temperature of the ALD process is less than or equal to about 350 degrees Celsius, such as less than about 350 degrees Celsius, for example from about 280 degrees Celsius to about 320 degrees Celsius. In some embodiments, the second precursor is a hydrogen-containing precursor, such as $H_2$ or $NH_3$. A carrier gas, such as Ar, may be flowed along with the second precursor. The second precursor removes the chlorine from the first precursor, and as a result, additional reaction sites become available for forming the next monolayer from the first precursor.

In some embodiments, the relatively low process temperature of the ALD process leads to improved selectivity of the silicide layer forming on the P-type S/D epitaxial features. For example, the S/D epitaxial features 154 are P-type S/D epitaxial features and include SiGe, and the S/D epitaxial features 152 are N-type S/D epitaxial features and include Si. The low temperature ALD process forms the silicide layer 172*p* on the S/D epitaxial features 154 and silicide layer 172*n* on the S/D epitaxial features 152. The silicide layer 172*p* is substantially thicker than the silicide layer 172*n*, as shown in FIG. 11B. In some embodiments, selectivity to SiGe is afforded by $MoCl_5$ lower adsorption energy on SiGe (1.55 eV) versus Si (1.74 eV). Furthermore, the desorption energy for chlorine from Si (1.82 eV) is higher than from SiGe (1.62 eV). In addition, the diffusion rate of Ge in molybdenum is substantially higher than the diffusion rate of Si in molybdenum at the relatively low temperature, such as less than about 350 degrees Celsius, for example from about 280 degrees Celsius to about 320 degrees Celsius. Thus, more reaction sites are available for growing MoSiGe from SiGe than growing MoSi from Si. In other words, the saturation point on the surface of the S/D epitaxial feature 154 is substantially greater than the saturation point on the surface of the S/D epitaxial feature 152. The lower adsorption energy of $MoCl_5$ on SiGe, the lower desorption energy of chlorine from SiGe, and the higher diffusion rate of Ge lead to forming the silicide layers 172*n*, 172*p* having substantially different thicknesses.

In some embodiments, the ALD process does not form a molybdenum metal layer. The chlorine-containing precursor, such as $MoCl_5$, may also function as an etchant to remove any molybdenum that is not attached to Si or Ge. Thus, after the ALD process, the molybdenum atoms in the silicide layers 172*n*, 172*p* are all attached to either Si or Ge.

In some embodiments, the silicide layer 172*p* includes MoSiGe and has a thickness ranging from about 0.5 nm to about 6 nm, and the silicide layer 172*n* includes MoSi and has a thickness of less than about 0.5 nm. In some embodiments, the thickness of the silicide layer 172*n* is about 5 percent to about 50 percent of the thickness of the silicide layer 172*p*. The thickness of the silicide layers 172*n*, 172*p* may be controlled in any suitable manner, such as controlling the number of cycles of the ALD process. The silicide layer 172*p* formed on the S/D epitaxial feature 154 leads to a lower electrical resistivity for contacts compared to a Ti-based silicide layer.

Next, as shown in FIG. 11C, silicide layers 174*n*, 174*p* are formed on the silicide layers 172*n*, 172*p*, respectively. In order for Si and Ge to diffuse through the silicide layers 172*n*, 172*p* to react with the precursors to form the silicide layers 174*n*, 174*p*, the process temperature for forming the silicide layers 174*n*, 174*p* is substantially greater than the process temperature for forming the silicide layers 172*n*, 172*p*. In some embodiments, the process temperature for forming the silicide layers 174*n*, 174*p* ranges from about 400 degrees Celsius to about 500 degrees Celsius. In some embodiments, the thickness of the silicide layer 174*n* is substantially greater than the thickness of the silicide layer 174*p*, because less Ge is diffused through the thicker silicide layer 172*p* and more Si is diffused through the thinner silicide layer 172*n*. In other words, there are more Si at the surface of the silicide layer 172*n* to react with the precursors to form the silicide layer 174*n* than Ge at the surface of the silicide layer 172*p* to react with the precursors to form the silicide layer 174*p*. The silicide layers 174*n*, 174*p* may be formed by any suitable process. In some embodiments, a metal-containing precursor, such as a titanium-containing precursor or a tantalum containing precursor, may be used to form the silicide layers 174*n*, 174*p*. In some embodiments, the silicide layer 174*n* includes TiSi or TaSi, and the silicide layer 174*p* includes TiSiGe or TaSiGe. In some embodiments, the total thickness of the silicide layers 172*n*, 174*n* is substantially the same as the total thickness of the silicide layers 172*p*, 174*p*. In some embodiments, TiSi or TaSi formed on the S/D epitaxial feature 152 has a lower electrical resistivity for contacts compared to Mo-based silicide layer. Because the silicide layer 174*n* is substantially thicker than the silicide layer 172*n*, the electrical resistivity for contacts for the S/D epitaxial feature 152 is reduced. The thickness of the silicide layers 174*n*, 174*p* may be controlled in any suitable manner, such as controlling the duration of the deposition process.

The dual silicide formation process described above includes selectively forming the silicide layers 172*n*, 172*p* on the S/D epitaxial features 152, 154, respectively, followed by in-situ formation of the silicide layers 174*n*, 174*p* on the silicide layers 172*n*, 172*p*, respectively. Thus, the electrical resistivity for contacts for both the N-type S/D epitaxial feature 152 and the P-type S/D epitaxial feature 154 is reduced. Furthermore, the in-situ dual silicide formation process includes a single clean process prior to forming the silicide layers 172*n*, 172*p*. The reduced number of clean process can mitigate risk of dielectric damage and CD enlargement from excessive plasma or chemical surface clean. In addition, the dual silicide formation process allows precise thickness tailoring of both N-type and P-type silicide layers (i.e., the silicide layer 174*n* and the silicide layer 172*p*, respectively) without comprising one another. In other words, the thickness of the silicide layer 172*p*, which is the main silicide layer for the P-type S/D epitaxial feature 154, is formed independently of the silicide layer 174*n*, which is the main silicide layer for the N-type S/D epitaxial feature 152. As a result, optimal silicide layer thickness for contacts for both N-type S/D epitaxial feature and P-type S/D epitaxial feature can be achieved.

Figure 11E:
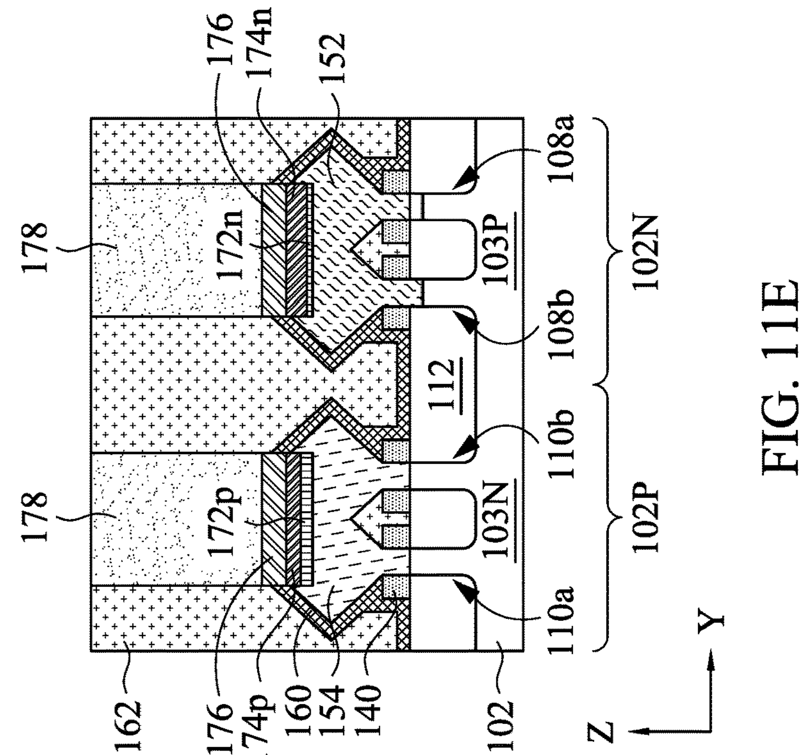
Figure 11D:
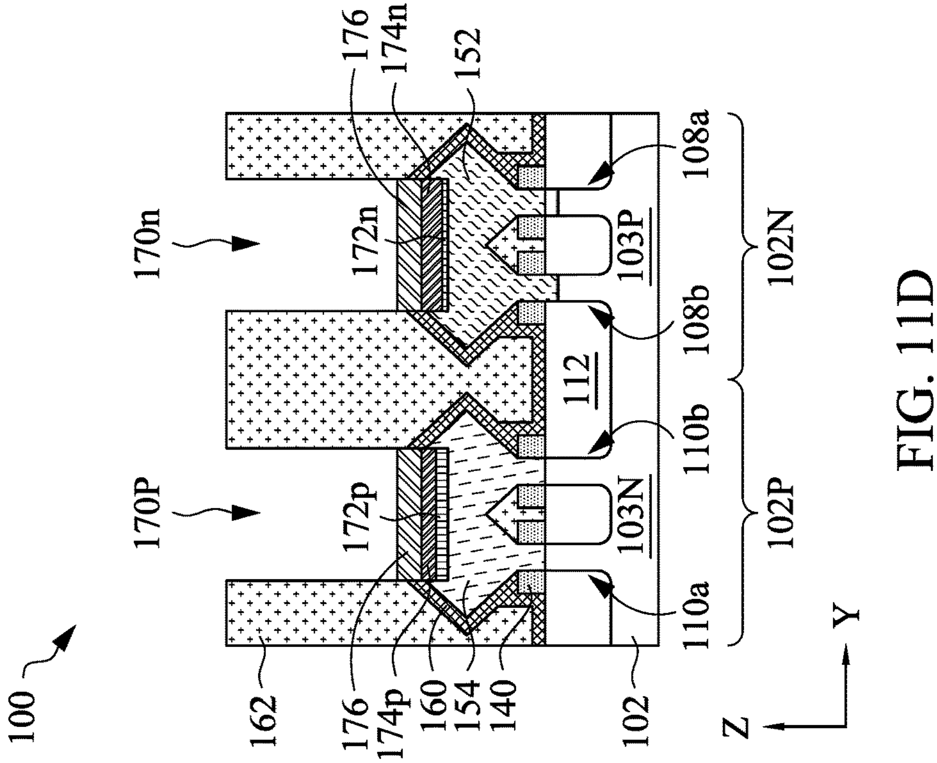

Next, as shown in FIG. 11D, a nitride layer 176 is formed on the silicide layers 174*p*, 174*n*. The nitride layer 176 may be electrically conductive and may be a metal nitride. The nitride layer 176 prevents oxidation of the silicide layers 174*p*, 174*n*. The nitride layer 176 may be formed by any suitable process. In some embodiments, the nitride layer 176 is formed by selectively forming a metal layer, such as Ti or Ta layer, on the silicide layers 174*p*, 174*n* followed by a nitridation process on the metal layer.

Next, a conductive feature 178 (i.e., S/D contacts) is formed in the contact openings 170*p*, 170*n* over the S/D epitaxial features 152, 154, as shown in FIG. 11E. The conductive feature 178 may be in contact with the nitride layer 176. The conductive feature 178 may include an electrically conductive material, such as one or more of Ru, Mo, Co, Ni, W, Ti, Ta, Cu, Al, TiN and TaN. The conductive feature 178 may be formed by any suitable process, such as PVD, CVD, ALD, electro-plating, or other suitable method.

The present disclosure provides the semiconductor device structure 100 and the method of forming the same. In some embodiments, the structure includes an N-type S/D epitaxial feature 152 and a P-type S/D epitaxial feature 154. A first silicide layer 172*n* is disposed on the N-type S/D epitaxial feature 152, and a second silicide layer 172*p* is disposed on the P-type S/D epitaxial feature 154. The thickness of the second silicide layer 172*p* is substantially greater than the thickness of the first silicide layer 172*n*. A third silicide layer 174*n* is disposed on the first silicide layer 172*n*, and a fourth silicide layer 174*p* is disposed on the second silicide layer 172*p*. Some embodiments may achieve advantages. For example, the second silicide layer 172*p* reduces electrical resistivity for contact for the P-type S/D epitaxial feature 154, while the third silicide layer 174*n* reduces electrical resistivity for contact for the N-type S/D epitaxial feature 152.

An embodiment is a structure. The structure includes an N-type source/drain epitaxial feature disposed over a substrate, a P-type source/drain epitaxial feature disposed over the substrate, a first silicide layer disposed directly on the N-type source/drain epitaxial feature, and a second silicide layer disposed directly on the P-type source/drain epitaxial feature. The first and second silicide layers include a first metal, and the second silicide layer is substantially thicker than the first silicide layer. The structure further includes a third silicide layer disposed directly on the first silicide layer and a fourth silicide layer disposed directly on the second silicide layer. The third and fourth silicide layer include a second metal different from the first metal, and the third silicide layer is substantially thicker than the fourth silicide layer.

Another embodiment is a method. The method includes forming an N-type source/drain epitaxial feature over a substrate, forming a P-type source/drain epitaxial feature over the substrate, and selectively depositing a first silicide layer. The first silicide layer includes a first portion disposed directly on the N-type source/drain epitaxial feature and a second portion disposed directly on the P-type source/drain epitaxial feature. The second portion is substantially thicker than the first portion. The method further includes depositing a second silicide layer. The second silicide layer includes a third portion disposed directly on the first portion of the first silicide layer and a fourth portion disposed directly on the second portion of the first silicide layer. The third portion is substantially thicker than the fourth portion.

A further embodiment is a method. The method includes forming an N-type source/drain epitaxial feature over a substrate, forming a P-type source/drain epitaxial feature over the substrate, and performing an atomic layer deposition process to simultaneously form a first silicide layer directly on the N-type source/drain epitaxial feature and a second silicide layer directly on the P-type source/drain epitaxial feature. The second silicide layer is substantially thicker than the first silicide layer. The method further includes performing a deposition process to simultaneously form a third silicide layer directly on the first silicide layer and a fourth silicide layer directly on the second silicide layer. The third silicide layer is substantially thicker than the fourth silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A structure, comprising:

an N-type source/drain epitaxial feature disposed over a substrate;

a P-type source/drain epitaxial feature disposed over the substrate;

a first silicide layer disposed directly on the N-type source/drain epitaxial feature;

a second silicide layer disposed directly on the P-type source/drain epitaxial feature, wherein the first and second silicide layers comprise a first metal, and the second silicide layer is substantially thicker than the first silicide layer;

a third silicide layer disposed directly on the first silicide layer; and a fourth silicide layer disposed directly on the second silicide layer, wherein the third and fourth silicide layer comprise a second metal different from the first metal, and the third silicide layer is substantially thicker than the fourth silicide layer.

2. The structure of claim 1, wherein the first metal comprises molybdenum.

3. The structure of claim 2, wherein the second metal comprises titanium.

4. The structure of claim 3, wherein the first silicide layer further comprises MoSi, the second silicide layer further comprises MoSiGe, the third silicide layer further comprises TiSi, and the fourth silicide layer further comprises TiSiGe.

5. The structure of claim 1, further comprising:

a first nitride layer disposed directly on the third silicide layer; and a second nitride layer disposed directly on the fourth silicide layer, wherein the first and second nitride layers comprise a same material.

6. The structure of claim 5, further comprising:

a first conductive feature disposed directly on the first nitride layer; and a second conductive feature disposed directly on the second nitride layer.

7. The structure of claim 1, where a total thickness of the first and third silicide layers is substantially the same as a total thickness of the second and fourth silicide layers.

8. A method, comprising:

forming an N-type source/drain epitaxial feature over a substrate;

forming a P-type source/drain epitaxial feature over the substrate;

selectively depositing a first silicide layer, wherein the first silicide layer comprises a first portion disposed directly on the N-type source/drain epitaxial feature and a second portion disposed directly on the P-type source/drain epitaxial feature, wherein the second portion is substantially thicker than the first portion; and depositing a second silicide layer, wherein the second silicide layer comprises a third portion disposed directly on the first portion of the first silicide layer and a fourth portion disposed directly on the second portion of the first silicide layer, wherein the third portion is substantially thicker than the fourth portion.

9. The method of claim 8, wherein the first silicide layer is deposited at a first process temperature, and the second silicide layer is deposited at a second process temperature substantially greater than the first process temperature.

10. The method of claim 9, wherein the first process temperature is less than or equal to about 350 degrees Celsius, and the second process temperature ranges from about 400 degrees Celsius to about 500 degrees Celsius.

11. The method of claim 8, further comprising depositing a metal layer on the second silicide layer and performing a nitridation process on the metal layer to form a nitride layer.

12. The method of claim 11, further comprising forming conductive features directly on the nitride layer.

13. The method of claim 8, further comprising forming contact openings to expose the N-type source/drain epitaxial feature and the P-type source/drain epitaxial feature, wherein the first silicide layer and the second silicide layer are formed in the contact openings.

14. A method, comprising:

forming an N-type source/drain epitaxial feature over a substrate;

forming a P-type source/drain epitaxial feature over the substrate;

performing a first deposition process to simultaneously form a first silicide layer directly on the N-type source/drain epitaxial feature and a second silicide layer directly on the P-type source/drain epitaxial feature, wherein the second silicide layer is substantially thicker than the first silicide layer; and performing a second deposition process to simultaneously form a third silicide layer directly on the first silicide layer and a fourth silicide layer directly on the second silicide layer, wherein the third silicide layer is substantially thicker than the fourth silicide layer.

15. The method of claim 14, wherein the first deposition process comprises:

flowing a metal-containing precursor into a processing chamber; and flowing a hydrogen-containing precursor into the processing chamber.

16. The method of claim 15, wherein the metal-containing precursor comprises $MoCl_5$.

17. The method of claim 16, wherein the first deposition process is performed at a first process temperature.

18. The method of claim 17, wherein the second deposition process is performed at a second process temperature substantially greater than the first process temperature.

19. The method of claim 18, wherein the first process temperature ranges from about 280 degrees Celsius to about 320 degrees Celsius.

20. The method of claim 14, wherein the third and fourth silicide layers comprise a metal different from a metal of the first and second silicide layers.

* * * * *